(12) United States Patent
Makosinski et al.

(10) Patent No.: US 10,573,799 B2
(45) Date of Patent: Feb. 25, 2020

(54) CAPTURING THERMOELECTRICITY FROM BEVERAGES

(71) Applicant: MAKOTRONICS ENTERPRISES INC., Victoria (CA)

(72) Inventors: Ann Makosinski, Victoria (CA); Arthur Makosinski, Victoria (CA)

(73) Assignee: Ann Makosinski, Victoria, British Columbia (CA)

( * ) Notice: Subject to any disclaimer, the term of this patent is extended or adjusted under 35 U.S.C. 154(b) by 0 days.

(21) Appl. No.: 15/078,301

(22) Filed: Mar. 23, 2016

(65) Prior Publication Data

US 2016/0284965 A1 Sep. 29, 2016

Related U.S. Application Data

(60) Provisional application No. 62/137,291, filed on Mar. 24, 2015.

(51) Int. Cl.
*H01L 35/30* (2006.01)
*H01L 35/32* (2006.01)
*A47G 19/22* (2006.01)

(52) U.S. Cl.
CPC .......... *H01L 35/32* (2013.01); *A47G 19/2227* (2013.01)

(58) Field of Classification Search
CPC ................................. H01L 35/32; F02B 21/02
USPC .............................. 62/3.2, 3.62, 457.3, 457.9
See application file for complete search history.

(56) References Cited

U.S. PATENT DOCUMENTS

| | | | | |
|---|---|---|---|---|
| 6,000,224 A | * | 12/1999 | Foye | A47G 19/2288 62/3.2 |
| 6,119,461 A | * | 9/2000 | Stevick | F25B 21/04 62/3.3 |
| 2011/0175461 A1 | * | 7/2011 | Tinaphong | H02J 17/00 307/149 |
| 2014/0159638 A1 | * | 6/2014 | Ebersold | H02J 7/0068 320/101 |
| 2015/0182046 A1 | * | 7/2015 | Walsh | A47G 19/2227 206/459.5 |

FOREIGN PATENT DOCUMENTS

CN 203016502 U * 6/2013
CN 104490200 A * 4/2015

OTHER PUBLICATIONS

English machine translation of CN 203016502 U from Google Translate. (Year: 2018).*
English machine translation of CN-104490200-A (Year: 2019).*

* cited by examiner

*Primary Examiner* — Angelo Trivisonno

(57) ABSTRACT

Provided is a portable, thermoelectrically powered device in form of a modified vessel and attachments, for extracting electricity from the temperature differential of liquids, slurries, and solids, and that of ambient air. The device utilizes two container surfaces with a temperature differential between them, and at least one thermoelectric generator in electrical communication with circuitry comprising at least one step up DC-DC voltage converter. In a preferred embodiment, the device includes a second DC-DC voltage converter and a storage battery to provide electrical power at a selected voltage to external personal devices such as cell phones, iPods, flashlights, and tablets for recharging or operation of those external devices.

3 Claims, 8 Drawing Sheets

CAPTURING THERMOELECTRICITY FROM BEVERAGES

CROSS-REFERENCE TO RELATED APPLICATIONS

This application claims priority to U.S. 62/137,291, filed Mar. 24, 2015, which is incorporated herein by reference.

FIELD

The present technology relates to a modified vessel and attachments for the consumption or storage of hot or cold liquids or solids, and which utilizes a thermoelectric generator and the temperature differential between that of a substance contained in the vessel and ambient air, to produce and store electricity. In many embodiments, the substance can be a beverage for consumption.

BACKGROUND

Personal portable devices such as cell phones, tablets, and flashlights rely on an internal power source such as a battery. These sources are used irregularly, and often fail when needed because the internal rechargeable batteries have been exhausted.

As a result, alternative designs have been developed that provide a ready power source for such an emergency. These usually take form of portable, compact battery packs in various forms and sizes, which provide additional battery capacity. All connect to the portable devices through their power ports.

One such product distributed by Apple Computer is the Mophie Juice Pack Powerstation External Battery. It is designed for such devices as iPhone, iPad and iPod. The product contains a rechargeable lithium-ion battery that can charge the internal battery on iPhone, iPad and iPod in a matter of minutes. The product connects to the device through a universal serial bus (USB) charging cable.

There are many other products that have the same function, all designed to run the personal portable devices for longer periods, or to quickly recharge the device in an emergency.

It is known that thermoelectric generators such as Peltier modules or tiles, working on the Seebeck Principle, can be used to produce electric current. The Seebeck Effect states that electric current is produced when two dissimilar metals (such as bismuth and telluride) are joined, and one side of their junction is cooled while the other is heated. As in U.S. Pat. No. 7,626,114 a thermoelectric power supply converts thermal energy into a high power output with voltages in the millivolt to Volt range for powering a microelectronic device and comprises an in-plane thermoelectric generator, a cross-plane thermoelectric generator, an initial energy management assembly, a voltage converter and a final energy management assembly.

There exists a need to provide a portable power source that can be powered thermoelectrically, using thermoelectric generators.

SUMMARY

The present technology is a device which includes a vessel and attachments for containing hot or cold liquid or solid such as beverage or even a non-consumable substance, and uses a thermoelectric generator to produce and store electricity from the temperature difference between the inside and outside temperature of the vessel.

One use of the invention can be as a power source which can be incorporated in a vessel used daily for but not limited to eating or drinking, or wherever heat energy is released. Such a device can capture the thermal difference, convert it to electricity which is accumulated with everyday use, and releasing it only when needed as a power source to a portable personal device. Such a power source can similarly be employed for other uses having similar power requirements.

In one embodiment, the device is built into the base of a dual wall vessel, or container, where it captures energy and stores it in a battery located in the container base or in the container handle.

In another embodiment, the device is contained in a lid which can be used as a cover for a cup of hot or cold drink. In that embodiment, the container can be dual or single walled.

In yet another embodiment, the device is a modified thermos (i.e., vacuum flask) mug where the thermoelectric generators are sandwiched between the two containers and the electronics is in the base or the handle of the mug.

In two other embodiments the device is a detachable base that goes under a cup or a vessel.

In many embodiments, the device includes one or more thermoelectric generators positioned between two surfaces which exhibit a temperature differential, that being a hot or cold liquid but not limited to beverage, and ambient air. The varying electricity produced from either of the mentioned embodiments, is then converted to charge a fixed internal battery. The battery voltage and current is then preferably converted again and made accessible as a steady source via a power converter, such as but not limited to a USB connector, or transmitted wirelessly, and can be used for charging personal portable devices such as cell phones, tablets, music players, radios, flashlights, and others.

BRIEF DESCRIPTION OF THE DRAWINGS

The drawings illustrate, by way of example only, embodiments of the present disclosure.

DETAILED DESCRIPTION

Much energy is used for heating or cooling substances in industry and for personal use. The technology described herein addresses this issue with a heat recovery and storage system that can be adopted to any scale and used in industry, business, and homes.

The description herein focuses on an innocuous recovery of heat from one of the smallest, but the most prolific waste source, which is the cooling off of hot beverages, and provides a solution for the use of the recovered power.

Except as otherwise expressly provided, the following rules of interpretation apply to this specification (written description, claims and drawings): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, The terms "comprising," "having," "including," and "containing" are to be construed as open-ended terms (i.e., meaning "including, but not limited to,") unless otherwise noted.

To the extent necessary to provide descriptive support, the subject matter and/or text of the appended claims is incorporated herein by reference in their entirety. Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

All methods described herein can be performed in any suitable order unless otherwise indicated herein or otherwise clearly contradicted by context. The use of any and all examples, or exemplary language (e.g., "such as") provided herein, is intended merely to better illuminate the example embodiments and does not pose a limitation on the scope of the claimed invention unless otherwise claimed. No language in the specification should be construed as indicating any non-claimed element as essential.

The term "liquid" used here is used in general sense, and is not limited to beverages such as tea, coffee, soft drink, and other drinks, but also refers to slurries and other combination of liquids and solids. The invention is contemplated to work in the same manner for the recovery of energy from hot or cold non-consumable substances.

Figures 1, 1A:
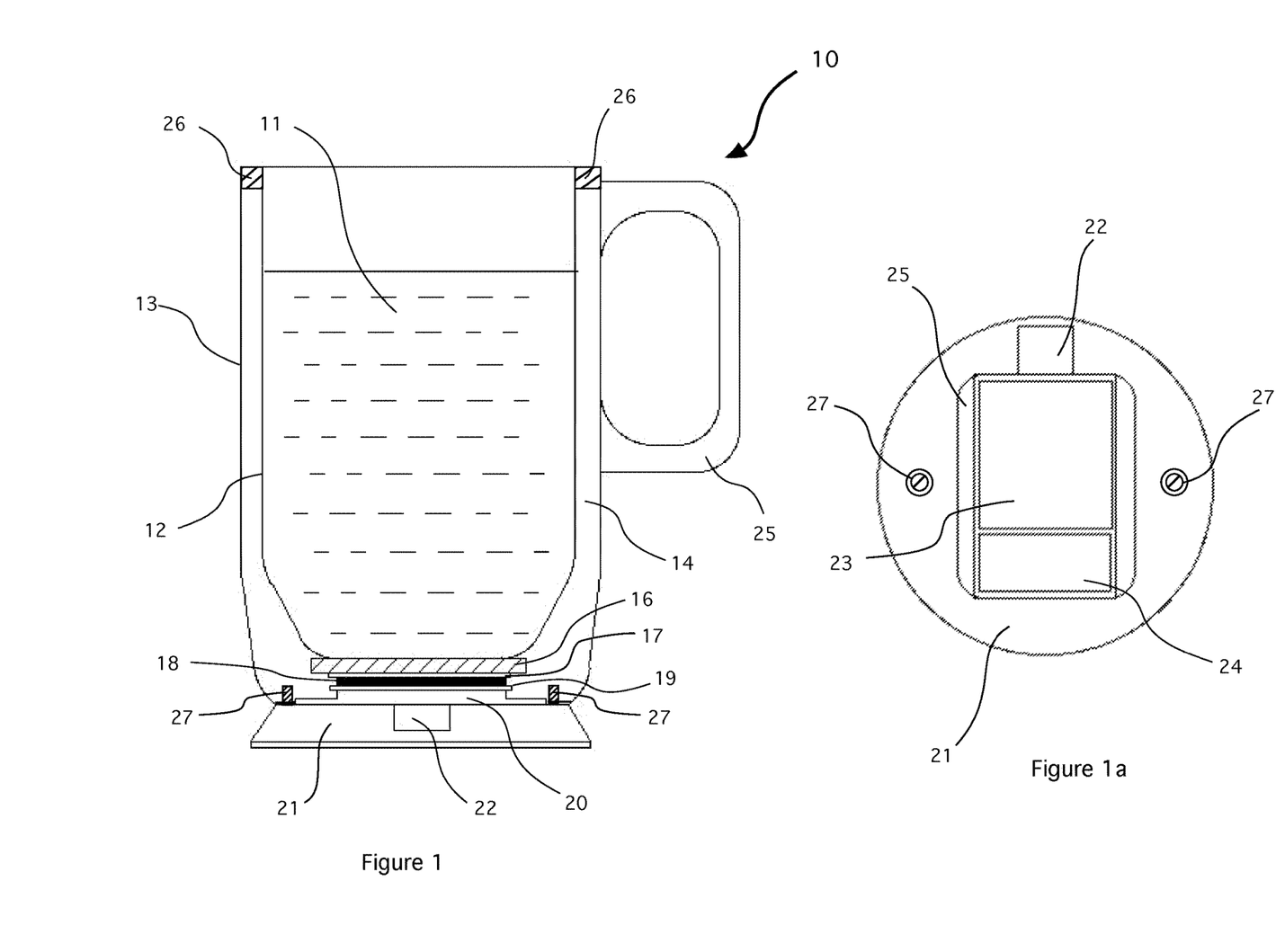
FIG. 1 shows a medial longitudinal cross-sectional view of a dual wall mug of the present technology with a frontal-section view of the thermoelectric base of the present technology.
FIG. 1a shows the bottom view of the thermoelectric base with cutout showing the location of the storage battery and circuit board.

A mug or a vessel such as a dual wall beverage container referred to in FIG. 1, as 10, has twin containers and can be between more or less 2 and 4 inches in diameter and between more or less 2 and 8 inches in height. The outer container 13, defined by one or more outer walls, and the inner container 12, defined by one or more inner walls, are normally connected together at the top part of the mug, and separated by space 14 which can be air, vacuum, or an inert gas throughout the rest of the mug. The thermal separation between the two containers can be significantly improved by adding a non-metal thermal insulation ring 26 where the two metal containers normally meet. A beverage container of this type is held by handle 25. At rest it stands with container 13 making contact with a flat surface through a thin layer of heat conducting rubber.

Embodiment One

In the first embodiment of the invention, the vessel for retaining a beverage generally referred here as a container 10, is shown in FIG. 1. Container 10 includes an outer container 13 and an inner container 12. The bottom of the outer container 13 has a clear opening of more or less 1.75 inches diameter so as to give access the inner container 12. A round, flat rim of about 0.25 inches is left at the outside perimeter of container 13.

Base 21 is machined from aluminum or other heat conducting material. A section 25, about 0.25 inches deep is hollowed, or milled out to make room for the circuitry 23, battery 24, and a USB or other connector 22. The outer container 13 fits on top of the base 21, and they can be attached together by means of two or more fasteners 27.

A thermoelectric generator 18 otherwise known as Peltier tile and including two, flat ceramic or metal tiles 17 and 18 and an inner array of junctions in between. The thermoelectric generator is placed between the inner container 12 and the solid base 20 and 21.

If the bottom of the inner container 12 is made slightly curved, a heat conductive elastic material 16 is placed between the inner container 12 and the top side 17 of the thermoelectric generator. The elastic material compensates for the curvature of container 12 and provides an even thermal-contact with the flat top of the thermoelectric generator 17. The bottom part of the thermoelectric generator 19 makes good thermal contact with the aluminum pedestal 20, which is the top section of the base 21.

The bottom of base 21 is shown in FIG. 1A, and when the vessel is at rest, this part stands on a flat surface such as a table. Base 21 contains a hollowed section 25, sufficiently deep to house the electronic circuitry 23, battery 24, and a USB or other connector 22 within the base. A metal bottom plate covers the parts and the cut-out.

When a liquid such as a hot beverage 11 is poured into the interior of the inner container 12 of the vessel, the heat passes from the bottom of the container, through the layer 16, to the top tile 17 of the thermoelectric generator 18.

At the same time, the bottom tile 19 of the thermoelectric generator 18 rests on the aluminum base 20 and 21 which is thermally connected to the cool, outer container 13.

Base 21 is therefore cooled in two ways, by convection cooling of the outer container 13, and by thermal conduction with table surface or whatever surface the vessel stands on.

In such a way a large temperature differential is set up across the thermoelectric element 18, generating a useful amount of electric current. For example, in a typical application when a hot beverage such as tea or coffee is poured into container 12, it may have a temperature of 90 degrees Celsius, while the ambient temperature is 20 degrees Celsius. The resultant 70 degree temperature differential is transmitted across the thermoelectric generator and produces over 1.2 Volts, and typically between 5 and 50 milliamperes of current.

As the beverage cools off, the voltage and current drop down, but for about 20 minutes, the present invention produces enough electrical energy to partially charge an internal storage battery.

Figure 7:
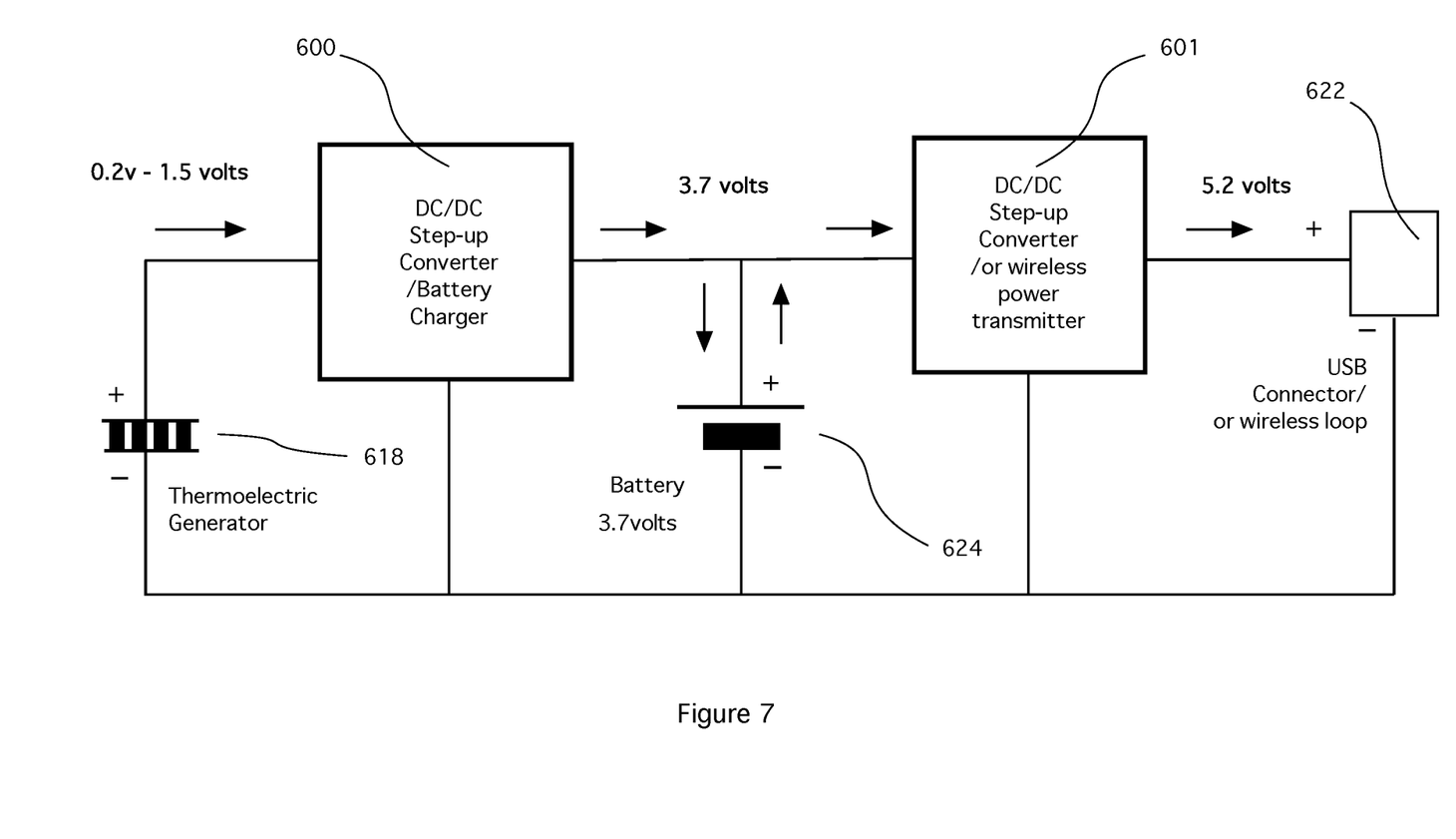
FIG. 7 shows a block diagram of the electronics used for capturing storage and retrieval of the electrical energy of the present technology.

The electronic operation of all the embodiments in this disclosure is almost identical, and the low voltage and current generated by the thermoelectric generator is processed in a manner shown in FIG. 7.

To convert the varying low voltage of approximately 0.2 and 1.5 volts, to charge a standard lithium battery of 3.7 volts, a voltage converter circuit 600 or similar is used. The first DC☐DC converter steps up the voltage output from the thermoelectric generator 618 to approximately 4 volts, which is enough to charge the lithium battery 624. The converter includes but is not limited to a Linear Technology integrated circuit LTC1305, or Texas Instruments bq25504, or similar circuit made by other manufacturers.

In this manner a small 3.7 volt battery of a 100 milliampere/hour or more or less capacity can be fully charged by consumption of liquids such as hot drinks over a period of a few days. The power from the battery 624 can be used at 3.7 volts from this point on, but for more practical uses the voltage needs to be converted again to a higher voltage such as 5 volts, which is what is needed to charge cell phones, tablets, and other portable devices. An LED lamp or an LCD indicator can be added to allow a visible display of the amount of charge in the battery 624.

The second DC-DC power conversion includes a different converter circuit 601, one that works with higher input currents and output voltages, and one that can quickly transfer the charge from the lithium battery 624, to a rechargeable battery in a personal portable device, or a flashlight, or any other electrical or electronic device, through a USB or other electrical connector 622.

In one example, a Linear Technology integrated circuit the LT1302-5 is utilized as converter 601, but other circuits exist that can do similar work. The converter 601 voltage steps up the 3.7 volts to 5.2 volts and enables limiting of the charging current and voltage by discrete external components.

The converter 601 then provides the correct voltage and current level for charging batteries through the USB port 622.

The electrical power from the internal rechargeable battery can also be transmitted wirelessly to devices that are equipped to receive it. In this manner, base 21 (FIG. 1) can be modified to include a resonant inductive loop, and converter 601 can be replaced by a radio frequency transmitter with transmitter/receiver specification requirements of the universal power charging standard such as the Qi, or others.

Figure 6:
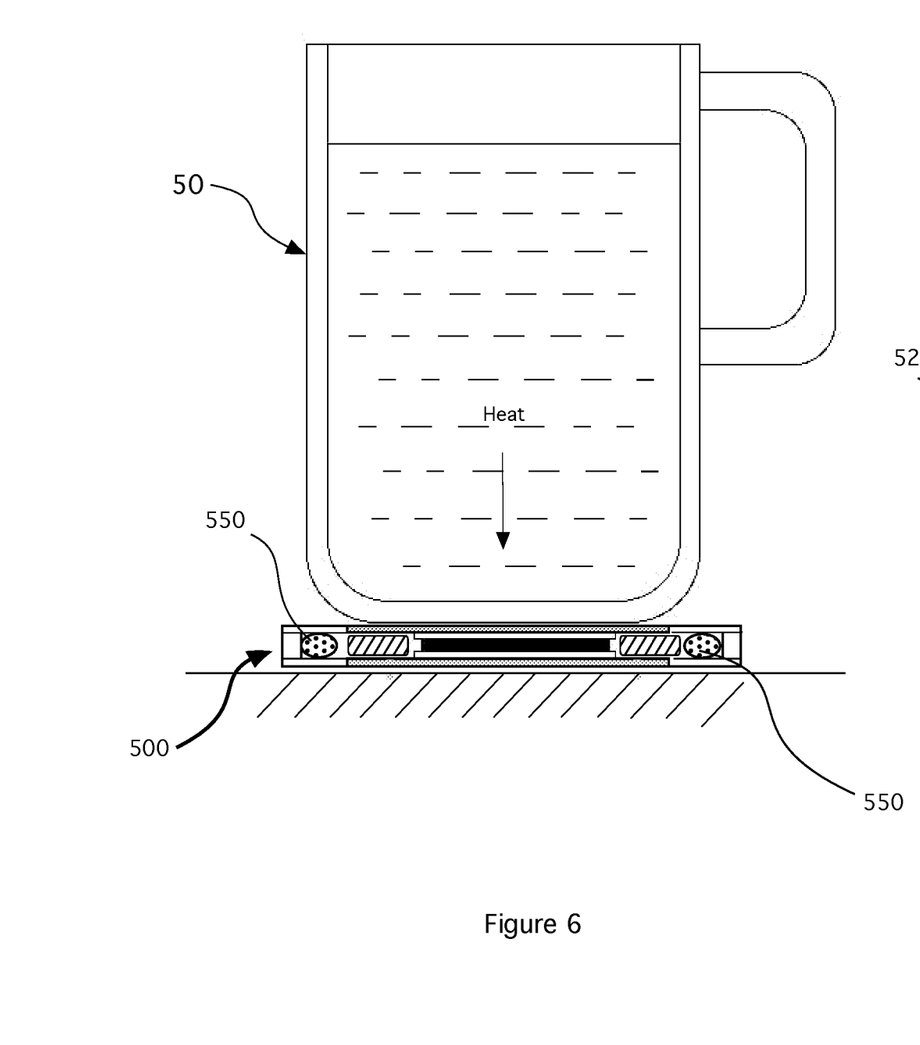
FIG. 6 shows a medial longitudinal cross-sectional view of a base assembly and the placement for a wireless transmitting loop.
Figure 6A:
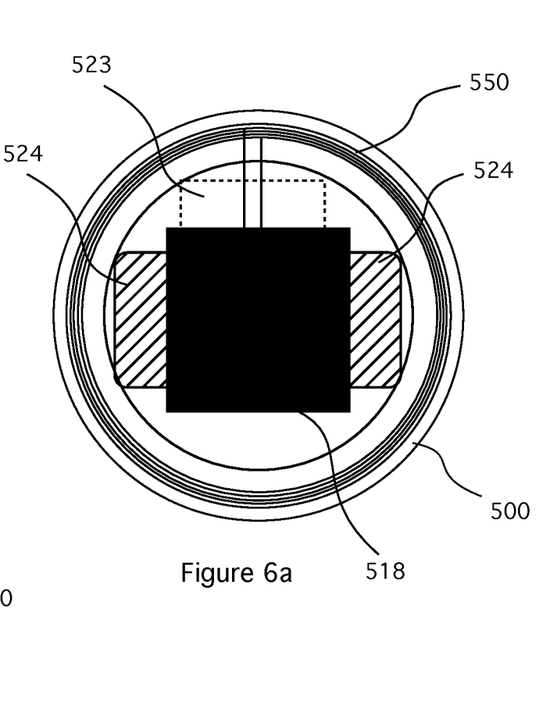
FIG. 6a is top cross-sectional view showing location of a wireless transmitting loop and other electronics in a vase assembly.

This is illustrated in FIGS. 6 and 6a, where suitable power transmitting inductor loop 550 is added in the base assembly 500, and batteries 524, and electronics 523 are relocated appropriately.

Embodiment Two

The second embodiment of the invention, is a vessel for retaining a beverage generally referred here as a container 10, is shown in FIG. 1. This embodiment is similar to embodiment one, with the exception of the base section 21 being removable for the purpose of washing the vessel. Container 10 includes an outer container 13 and an inner container 12. The bottom of the outer container 13 has a clear opening of more or less 1.75 inches diameter so as to give access the inner container 12 and the positioning of a solid base 20, made wholly or partially from a material with good thermoelectric conductivity such as aluminum and providing a tight, waterproof seal between the outer container 13 and base 20.

A thermoelectric generator 18 otherwise known as Peltier tile, includes two, flat ceramic or metal tiles 17 and 19 and an inner array of junctions in between. The thermoelectric generator is placed between the inner container 12 and the solid base 20.

If the bottom of the inner container 12 is made slightly curved, a heat conductive elastic material 16 is placed between the inner container 12 and the top side 17 of the thermoelectric generator. The elastic material compensates for the curvature of container 12 and provides an even thermal-contact with the flat top of the thermoelectric generator 17. The bottom part of the thermoelectric generator 19 makes good thermal contact with base 20.

Figures 1B, 1C, 1D:
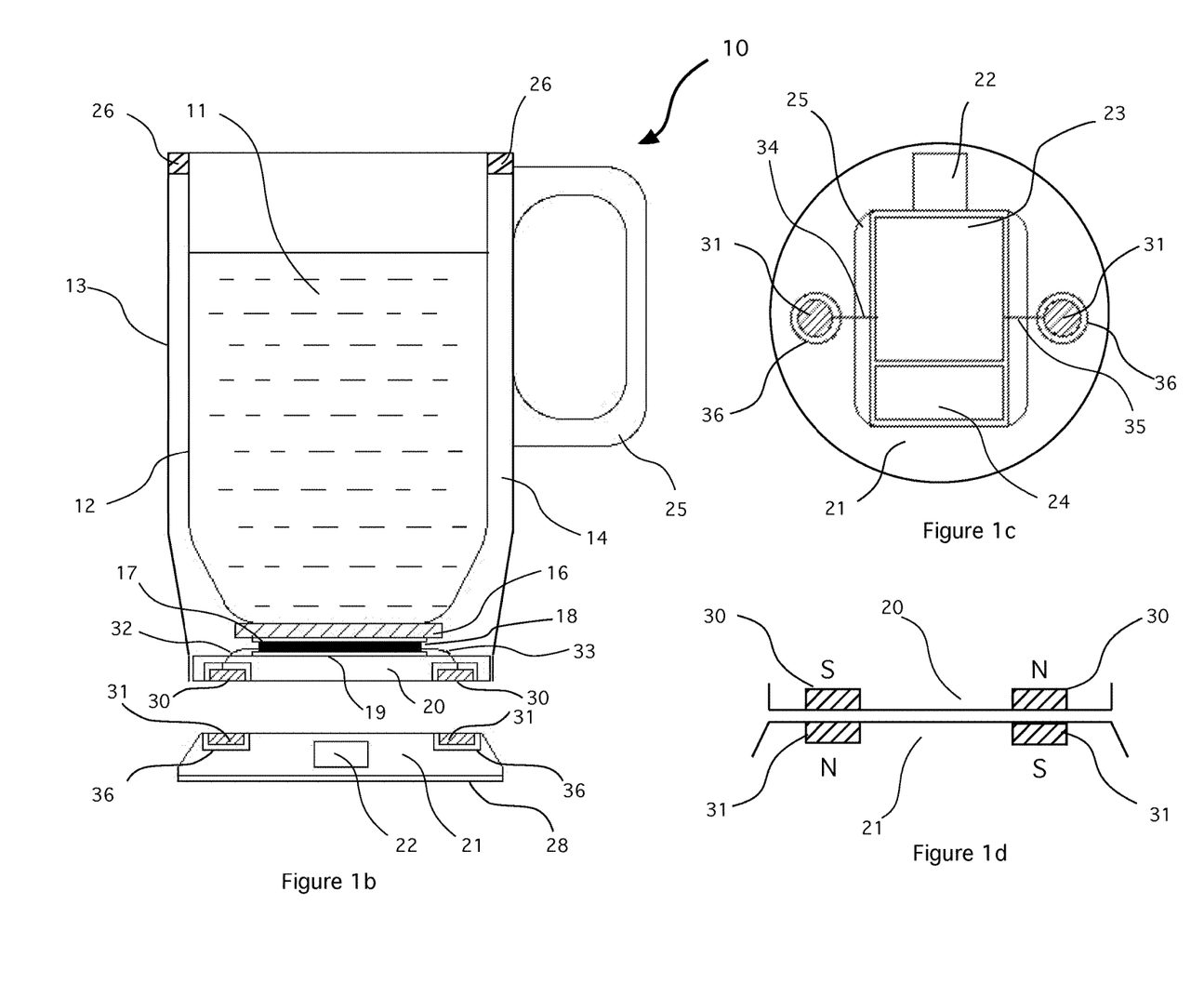
FIG. 1b shows a medial longitudinal cross-sectional view of a dual wall mug of the present technology with a frontal-section view of a detachable thermoelectric base of the present technology.
FIG. 1c shows the bottom view of the detachable thermoelectric base with cutout showing the location of the storage battery and circuit board.
FIG. 1d shows the positioning of magnets in the two bases used in embodiment two.

On the bottom of the base 20, are two small, strong magnets 30. The magnets are held in electrically isolating sleeves 36. One magnet 30 is in electrical communication with the positive polarity of the thermoelectric generator 18 through connection 32, while the second magnet 30 is in electrical communication with the negative polarity of the thermoelectric generator 18 through connection 33.

Base 21 is made wholly or partially from aluminum or other heat conducting material. It contains a hollowed section 25, deep enough to house the electronic circuitry 23, battery 24, and a USB or other connector 22. A metal bottom plate 28 covers the parts and the cut-out.

The bottom view of base 21 with cover plate 28 removed is shown in FIG. 1A.

Two, small but powerful magnets 31 are mounted in the top section of the base 21 in electrically isolating sleeves 36. As shown in FIG. 1c, one magnet 31 is in electrical communication with the positive input to the electrical circuitry 33 through a wire connection 34, while the second magnet 31 is in electrical communication with the negative input to the electrical circuitry 23 through a wire connection 35.

FIG. 1d is a cross sectional view of base 20 of the vessel 13, and base 21 and shows the placement of the magnets with opposite North-South (N-S) polarities. This positioning of the magnets will enable the base 21, to attach itself to Base 21 in only one possible rotation position, enabling correct electrical polarity between the thermoelectric generator 18 base 20 and the circuitry 23 in base 21.

In normal use, vessel 13 is placed on top of base 21. The strong magnetic force between the magnets 30 in base 20 of the vessel, and magnets 31 in base 21, hold the vessel and the base 21 together in a strong physical and good thermal contact. At that point also, electrical communication between magnets 30 in base 20 and magnets 31 in base also 21 occurs.

When a liquid such as a hot beverage 11 is poured into the interior of the inner container 12 of the vessel, the heat passes from the bottom of the container, through the layer 16, to the top tile 17 of the thermoelectric generator 18. At the same time, the bottom tile 19 of the thermoelectric generator 18 rests on the aluminum base 20 which is thermally connected to the cool, outer container 13, and the base 21.

Base 20 is therefore cooled in two ways, by convection cooling of the outer container 13, and by thermal conduction through base 21 to the surface of a table or other surface the vessel stands on.

In such a way a large temperature differential is set up across the thermoelectric element 18, generating a useful amount of electric current. For example, in a typical application when a hot beverage such as tea or coffee is poured into container 12, it may have a temperature of 90 degrees Celsius, while the ambient temperature is 20 degrees Celsius. The resultant 70 degree temperature differential is transmitted across the thermoelectric generator and produces over 1.2 Volts, and typically between 5 and 50 milliamperes of current.

As the beverage cools off, the voltage and current drop down, but for about 20 minutes, the present invention produces enough electrical energy to partially charge an internal storage battery.

The electronic operation of all the embodiments in this disclosure is almost identical, and the low voltage and current generated by the thermoelectric generator is processed in a manner shown in FIG. 7.

To convert the varying low voltage of approximately 0.2 and 1.5 volts, to charge a standard lithium battery of 3.7 volts, a voltage converter circuit 600 or similar is used. The first DC-DC converter steps up the voltage output from the thermoelectric generator to approximately 4 volts, which is enough to charge the lithium battery 624. The converter includes but is not limited to a Linear Technology integrated circuit LTC1305, or Texas Instruments bq25504, or similar circuit made by other manufacturers.

In this manner a small 3.7 volt battery of a 100 milliampere/hour or more or less capacity can be fully charged by consumption of liquids such as hot drinks over a period of a few days. The power from the battery 624 can be used at 3.7 volts from this point on, but for more practical uses the voltage needs to be converted again to a higher voltage such as 5 volts, which is what is needed to charge cell phones, tablets, and other portable devices. An LED lamp or an LCD indicator can be added to allow a visible display of the amount of charge in the battery 624.

The second DC-DC power conversion includes a different converter circuit 601, one that works with higher input currents and output voltages, and one that can quickly transfer the charge from the lithium battery 624, to a battery in a personal portable device, or a flashlight, or any other electrical or electronic device, through a USB or other connector 622.

In one example, a Linear Technology integrated circuit the LT1302-5 is utilized as converter 601, but other circuits exist that can do similar work. The converter 601 voltage steps up the 3.7 volts to 5.2 volts and enables limiting of the charging current and voltage by discrete external components.

The converter 601 then provides the correct voltage and current level for charging batteries through the USB port 622.

The electrical power from the internal rechargeable battery can also be transmitted wirelessly to devices that are equipped to receive it. In this manner, base 21 (FIG. 1b) can be modified to include a resonant inductive loop. Converter 601 can be replaced by a radio frequency transmitter with transmitter/receiver specification requirements of the universal power charging standard such as the Qi, or others.

This is illustrated in FIGS. 6 and 6a, where suitable power transmitting inductor loop 550 is added in the base assembly 500, and batteries 524, and electronics 523 are relocated appropriately.

Embodiment Three

Figures 2, 2A:
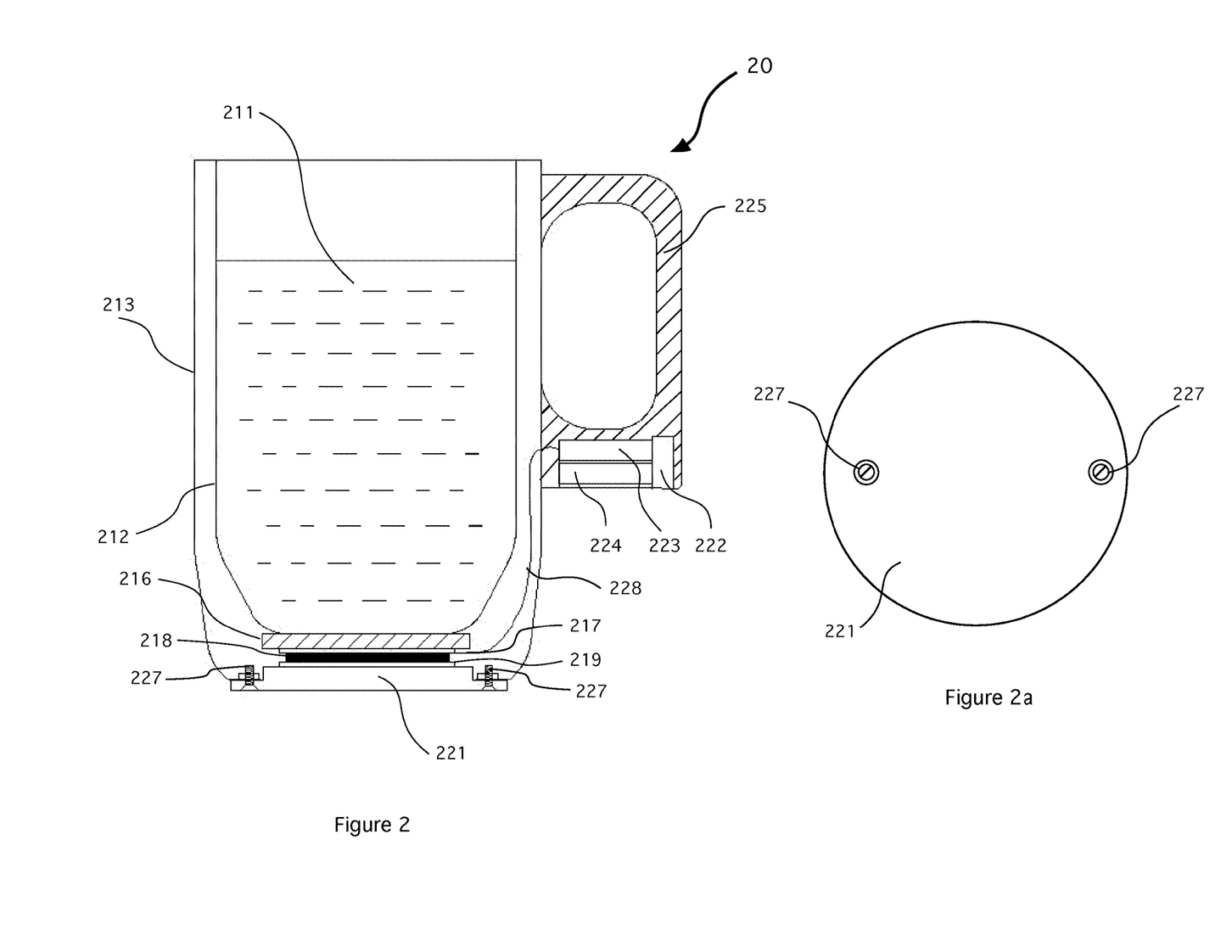
FIG. 2 shows a medial longitudinal cross-sectional view of a dual wall mug and handle of the present technology with a cross-section view of the thermoelectric base of the present technology.
FIG. 2a shows the bottom view of the thermoelectric base with fasteners.

In embodiment three, the vessel is a liquid beverage container, generally referred to as 20, shown in FIG. 2, and when in use, filled with hot beverage 211. It is similar in construction to embodiment one, except for the placement of the storage battery 224, the electronics 223, and the output connector 222. FIG. 2 also depicts a hot beverage 211, heat conductive elastic material 216, a top side 217, and a thermoelectric generator 219.

Those components are now placed inside a cutout in the handle 225 and can be arranged in various different ways, only one of which is shown in FIG. 2.

The container base 221 is thinner than in embodiment one, and without cutouts for electronic components. The base 221 makes a good thermal connection with the bottom part of the outer container 213 by attachment with, though not limited to fasteners 227. Because the base 221 is solid, it provides low thermal resistance to the heat transmitted from container 212 via a heat conductive elastic material 216, then via the upper ceramic plate 217, and the lower ceramic plate 219, of the thermoelectric generator 218, to the outer container 213. The base 221 also makes a good thermal contact on whatever surface it stands on, and conducts the heat to that surface. The overall effect is to provide a larger temperature differential across the thermoelectric generator 218 and generate electrical power.

The thermoelectric generator 218 is in electrical communication with the electronics 223 in handle 225 via wires 228. Otherwise, electronics 223 works in communication with the internal battery 224 and the output connector 222 exactly the same as the electronics in embodiment one.

Embodiment Four

Figures 3, 3A, 3B, 3C:
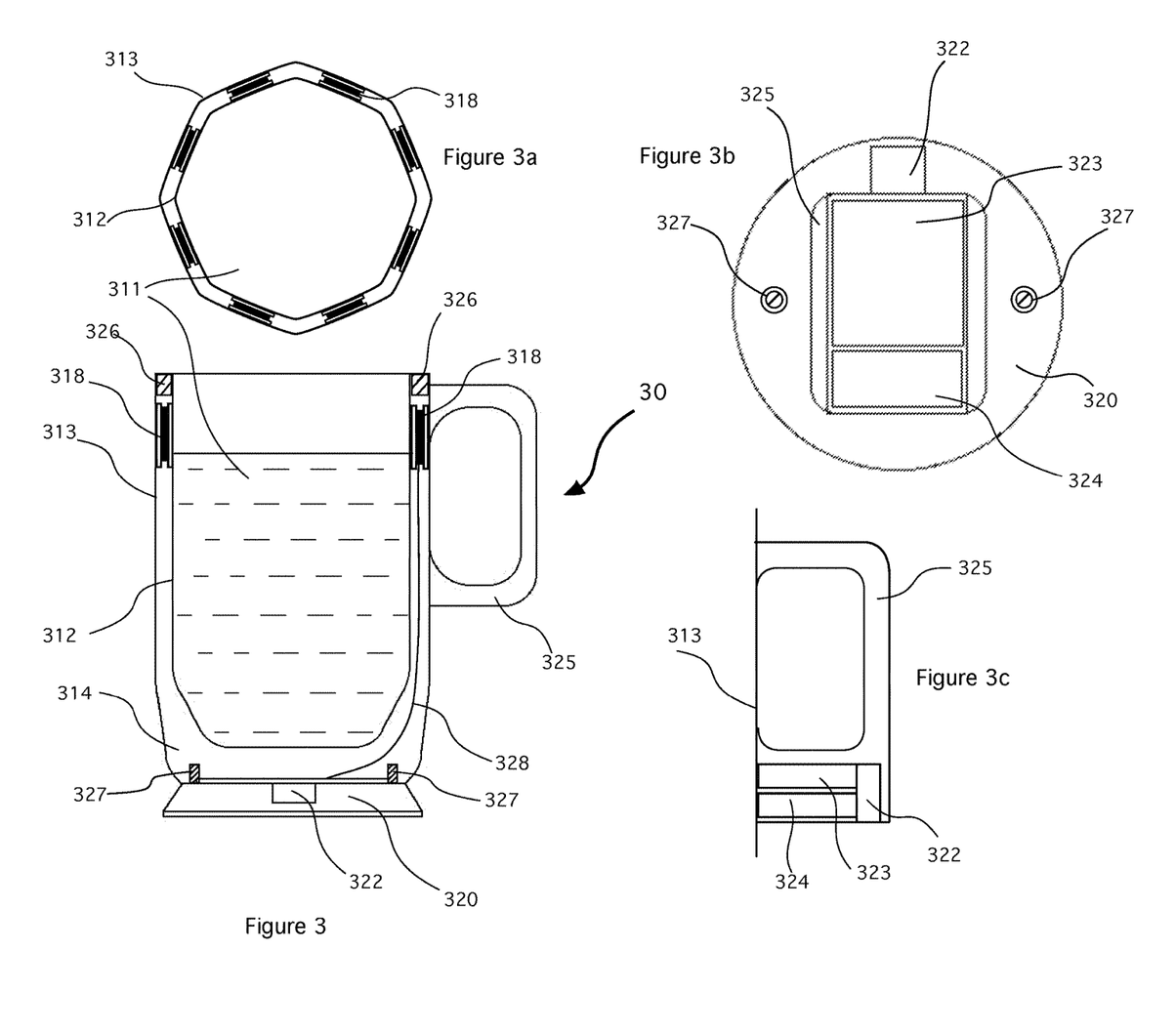
FIG. 3 shows a longitudinal cross-sectional view of a dual wall container of the present technology with thermoelectric generators in the walls, and a base containing the battery and electronics.
FIG. 3a shows a cross-sectional view of the top part of the container with eight thermoelectric generators located in the walls of the container.
FIG. 3b shows the bottom view of the container base with cutout showing the location of the storage battery, circuit board, and the output power connector.
FIG. 3c shows an alternate placement of the storage battery, circuit board, and the output power connector inside the container handle.

Embodiment four of the invention the vessel is a beverage container, generally referred to as 30 and shown in FIG. 3, in a cross-sectional view. The container 30 has the dimensions of a typical dual walled drinking mug or cup and includes two containers made from stainless steel or other materials, the outer container 313, and the inner container.

In the embodiment shown in FIG. 3, no lid is shown, but a regular lid can be used. FIG. 3 also depicts a pedestal 320, an insulation ring 326, and fasteners 327.

The outer shape of the mug maybe round or multisided with not less than four or six or eight or more sides, with both, the inner and outer container containing a number of flat sides. For instance, if eight thermoelectric generators are used, the container will have a hexagonal shape such as shown in FIG. 3a.

The multiple flat sides of the container enable good thermal connections with flat thermoelectric generators 318 which are placed in the space between the outer container 313 and the inner container 312. The part where the two containers normally connect together at the top of the mug, can be replaced by a high thermal resistance insulation ring 326 material such as plastic or rubber, but not limited to those two materials.

In this manner, as the hot liquid 311 is poured into the inner container 312, the container heats up. The outer container 313 stays cool because it is insulated from the container 312 by space 314, insulation ring 326, and it is exposed to ambient temperature. The base 320 makes a good thermal connection with the bottom part of the outer container 313 by attachment with, though not limited to fasteners 327. Since the thermoelectric generators are placed between the wall of the inner container 312 and the wall of the outer container 313, a temperature differential will be setup across the thermoelectric generators 318, and electric current will be produced.

The thermoelectric generators 318 may be connected in series or in parallel, or a combination of both, and are in electrical communication by wire leads 328 with the voltage converter electronics 323, which may be contained in the base 320 as shown in FIG. 3b, or in the handle 325, as shown in FIG. 3c.

The amount of voltage and current produced will depend on the size and number, and conversion efficiency of the thermoelectric generators 318, which can be ¾" square, but can also be smaller or larger as needed.

In a typical example, at the moment the boiled beverage is poured in, it has a temperature of over 90 degrees Celsius. With an ambient temperature of about 20 degrees Celsius, the temperature differential across the multiple generators is at its peak, and the generator can produce over 1.2 Volts, and 25 milliamperes of current. As the beverage cools off, the voltage and current produced drop significantly, but for about 20 minutes, the thermal generators produce a total average of about 10 milliamperes, enough energy to partially charge the internal battery 324.

The electronic circuitry otherwise works in the same way as explained in embodiment one, and as detailed in FIG. 7.

Embodiment Five

Figures 4, 4A, 4B:
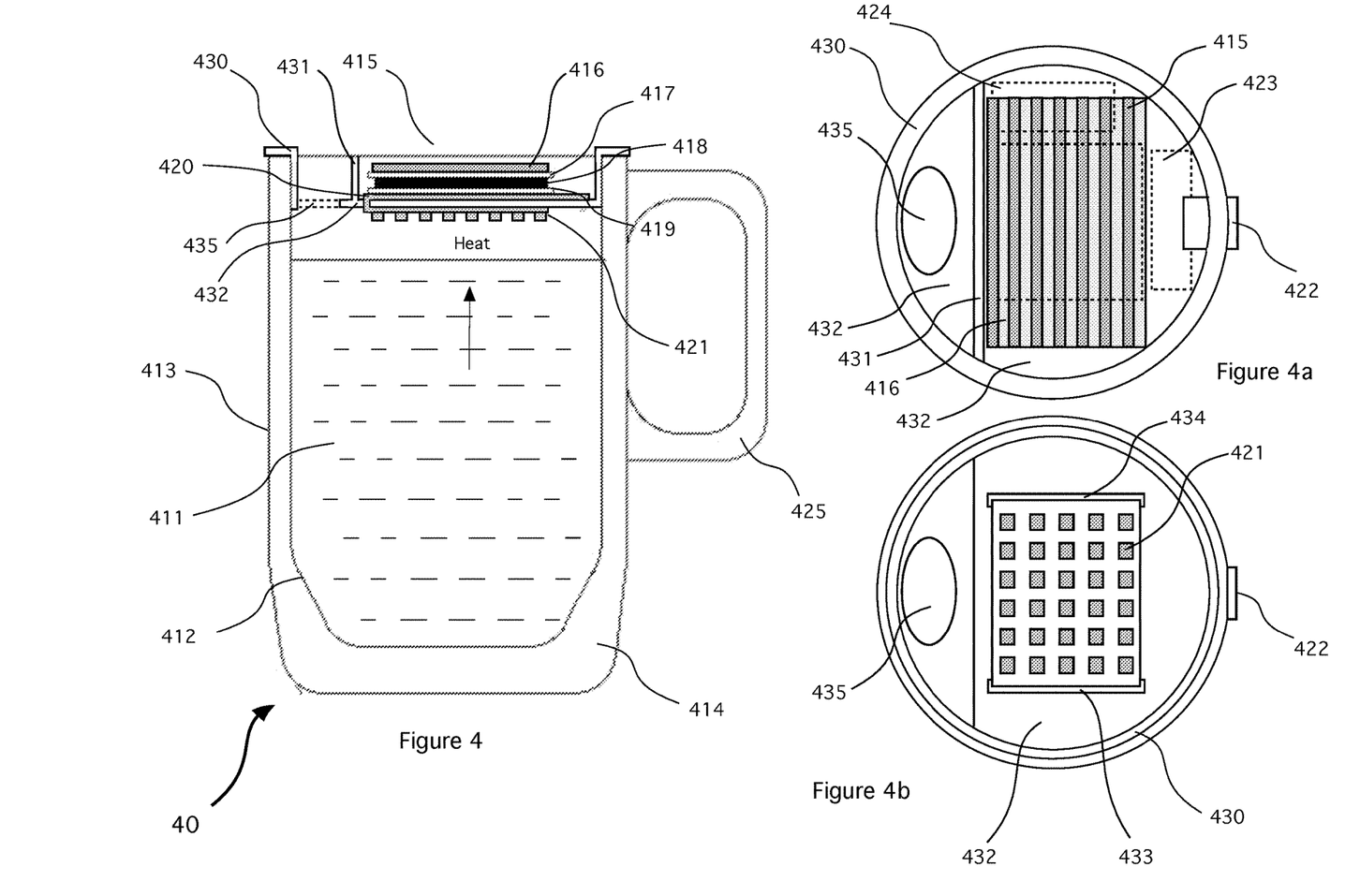
FIG. 4 shows a medial longitudinal cross-sectional view of a dual wall mug of the present technology with a cross-section view of the thermoelectric lid of the present technology.
FIG. 4a is a top view of the thermoelectric lid.
FIG. 4b is the bottom view of the thermoelectric lid.

In embodiment five, the vessel is a beverage container, generally referred to as 40, is shown in a cross-sectional view in FIG. 4. The container has the dimensions of a typical mug, glass, or a cup.

In this embodiment the heat to electrical energy conversion takes place only in the lid which also houses the electrical circuitry. Although a Thermos-like (or vacuum flask) configuration shown in FIG. 4 is preferred, and container 40 is shown with two stainless walls, the outer container 413, the inner container 412, and space 414 in-between, the vessel in this embodiment can also be single walled, without the outer container 413, and can be made from metal, ceramic, glass, plastic, paper, or other suitable materials, and may or may not have a handle 425.

In the embodiment shown in FIG. 4, the body of the lid 432, sits on top of the mug 40, or a cup, or can be hinged. The upper and lower sides of the lid are utilized for different purposes. The top part of the lid shown in FIG. 4a is exposed to the ambient air, while the bottom part of the lid shown in FIG. 4b faces down towards the beverage 411 and may touch the liquid. FIGS. 4 and 4a also depict a top side 417, circuitry 423, a handle 425, a container 430, and a wall 431.

The lid 430, and separator wall 431, are constructed from a plastic material such as ABS plastic, acrylic, or other material suitable to withstand steam. The lid has three through opening. The elliptical opening 435 is used for pouring or consuming the beverage. The narrow openings 433 and 434 are used for the passage of an aluminum channel 420, connecting a small heat sink 421 on the bottom of the lid, to the top of the lid where it is connected thermally to lower tile 419 of the thermoelectric generator 418, while the upper tile 417 of the thermoelectric generator, is attached to heat sink 416 with fins 415 exposed to, and cooled by ambient air.

In another version of embodiment four, the aluminum channel 420 can be omitted and the lower tile 419 of thermoelectric generator can protrude through a hole in the lid 432 and face the beverage.

In this manner, the hot air and steam from a beverage heat up side 419 of the thermoelectric generator directly, or through heat sink 421. In the case of the latter, the heat travels through the aluminum channel 420 to the 419 side of the thermoelectric generator 418, while the ambient air is coupled to the upper tile 417 of the thermoelectric generator via heat sink 416 with fins 415.

In typical use, when a hot substance 411 is emptied into the container 412, a temperature difference is built up between the two sides of the thermoelectric generator 418, and electric current is produced. For example, when boiled beverage is poured in, it has a temperature of 90 degrees Celsius. Ambient temperature is about 20 degrees Celsius. The resultant 70 degree temperature differential is transmitted quickly across the thermoelectric generator and produces more or less 0.8 Volts and about more or less 25 milliamperes of current.

As the beverage cools off, the voltage and current drop significantly, but for about 20 minutes, the lid produces enough energy to partially charge the internal battery 424 and is accessible through the connector 422.

The lid in this embodiment can also be adopted for placement around or under a paper cup or a glass or metal cup as done in embodiment six, and similar to embodiment one and two, using the table surface as the cooling element.

The electronic circuitry 423 otherwise works in the same way as explained in embodiment one, and as detailed in FIG. 7.

In all the mentioned embodiments, the polarity of the thermoelectric generator can be reversed with a switch, or by using an auto switching electronic circuit such as but not limited to the Linear Technology LTC 3109. In this way, electric current with correct polarity to power the voltage converters, will be produced from the temperature difference across the thermoelectric generator when the container holds an ice cold drink, and when there is warmer, ambient air outside the container.

Embodiment Six

Embodiment six is similar to embodiment two and five, which describe modules that are detachable from the vessels. It is most similar to embodiment five in that it is independent of the vessel, except that instead of fitting on top as a lid, embodiment six is a coaster-like base that fits under a vessel, and is independent of the diameter of the vessel used.

Figure 5:
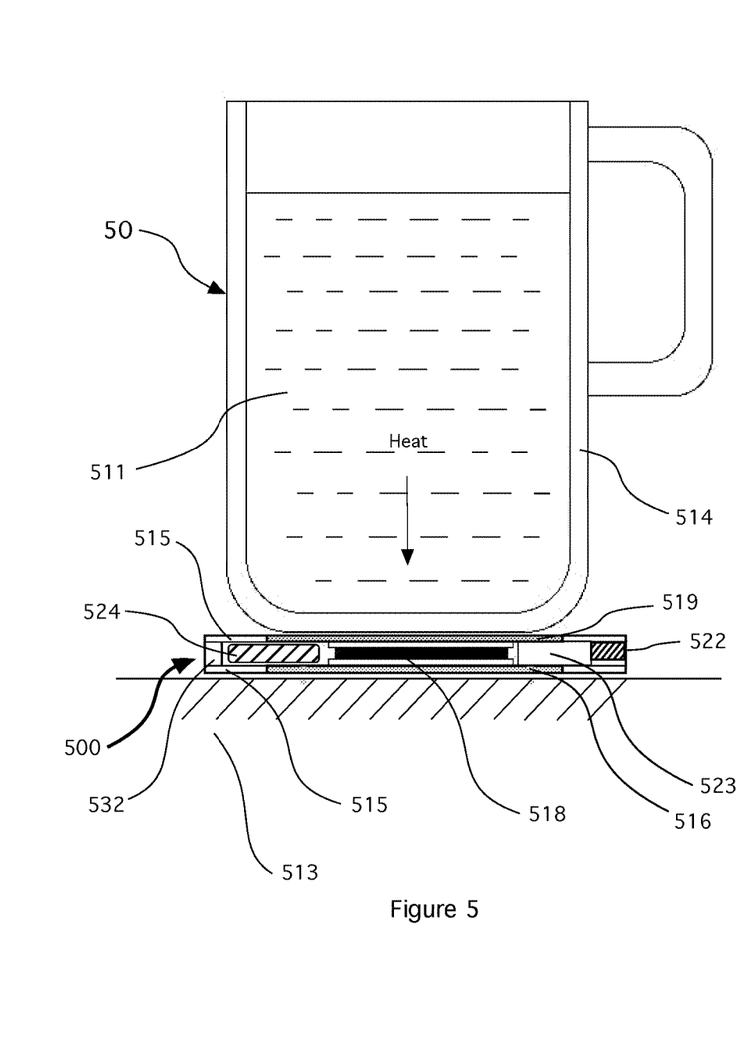
FIG. 5 shows a medial longitudinal cross-sectional view of a single wall mug positioned on top of the detachable thermoelectric base assembly of the present technology.

As shown in FIG. 5, this embodiment works best with single wall 514 vessels such as container 50, which can be made from metal, ceramic, glass, plastic, paper, or other suitable materials.

Container 50 has the dimensions of a typical mug, glass, or a cup, but can also be larger such as a cooking pan, a plate, or a dish. The container is positioned above and in thermal contact with a flat, coaster-shaped base assembly 500 which rest on a flat surface 513, such as a table, and shown in a cross-sectional view in FIG. 5.

The body of the base assembly 500 can be constructed from plastic or other poor heat conduction material (insulative material).

Figure 5A:
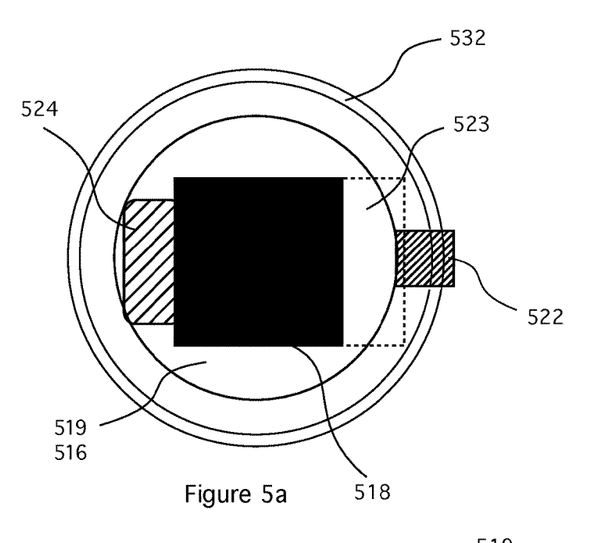
FIG. 5a is a top cross-sectional view of the detachable thermoelectric base assembly.
Figure 5B:
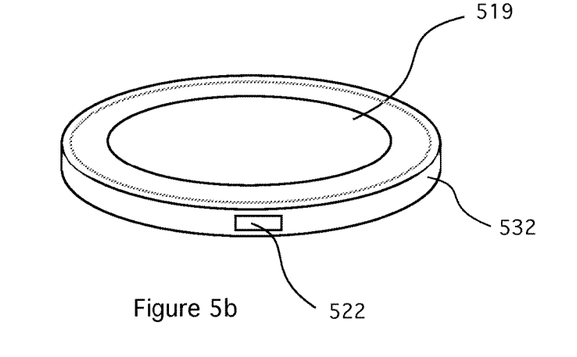
FIG. 5b is a 3D view of the detachable thermoelectric base assembly.

As shown in the top view of FIG. 5a, two, round or multisided plates are centered and leveled parallel with the top and bottom of the base thermal isolation rings 515, connecting to the assembly frame 532. These are coupling plate 519, and directly underneath, coupling plate 516, whose function is to collect and conduct heat from different diameter containers, couple it to the thermoelectric generator 518 and the table surface 513. Both plates are made from heat conductive material such as aluminum, copper, steel, graphite, or any other suitable material with good heat conductivity.

The top side of the thermoelectric module 518 is then in direct thermal contact with a coupling plate 519, and the bottom side of the module 518 is in thermal contact with the bottom coupling plate 516. The thermoelectric generator is also in electrical communication with the circuitry 523, a rechargeable battery 524, and a USB or other suitable connector 522 for external power recovery.

In normal operation, vessel 50 is placed on top of base assembly 500, which itself rests and is in good thermal contact with surface 513 such as a table. When hot liquid 511 is poured into vessel 50, heat is passed through the wall 514 of the vessel, then through the coupling plate 519 of the base, then through the thermoelectric generator 518, then through the lower coupling plate 516 of the base assembly, and into the surface 513, where it is dispersed.

As temperature differential is created between the two sides of the thermoelectric generator 518, electric current is produced. For example: boiled substance is poured in at a temperature of 90 degrees Celsius, and the ambient temperature is about 20 degrees Celsius. The resultant 70 degree temperature differential is transmitted quickly across the thermoelectric generator and produces more or less 0.8 Volts and about more or less 25 milliamperes of current. This figure can be much higher if larger, or multiple thermoelectric generators are used.

As the contents of vessel 50 cools off, the voltage and current drop significantly, but for about 20 minutes, the base assembly produces enough energy to partially charge the internal battery 624 and is accessible through the connector 622.

The electronic circuitry otherwise works in the same way as explained in embodiment one, and as detailed in FIG. 7 with the thermoelectric generator 618, followed by voltage converter 600 and 601, battery 624, and enabling external charging through USB connector or wireless loop 622.

The electrical power from the internal rechargeable battery can also be transmitted wirelessly to devices that are equipped to receive it. In this manner, the base assembly can be modified and converter 601 can be replaced by a radio frequency transmitter with transmitter/receiver specification requirements of the universal power charging standard such as the Qi, or others. This is illustrated in FIGS. 6 and 6a, where suitable power transmitting inductor loop 550 is added in the base assembly 500, and batteries 524, and electronics 523 are relocated appropriately in the base assembly 500.

In all the mentioned embodiments, the polarity of the thermoelectric generator can be reversed with a switch, or by using an auto switching electronic circuit such as but not limited to the Linear Technology LTC 3109. In this way, electric current with correct polarity to power the voltage converters, will be produced from the temperature difference across the thermoelectric generator when the container holds an ice cold drink, and when there is warmer, ambient air outside the container.

In all the six above-mentioned embodiments, the thermal retention inside the dual container mugs is slightly compromised and the substance in the container will cool down faster. One advantage is that if the substance is a hot beverage, it will reach a safe drinking temperature faster, while at the same time harvesting the temperature differential as electrical power, and allowing for a variety of end uses, such as charging batteries in personal portable devices.

While the foregoing provides certain non-limiting example embodiments, it should be understood that combinations, subsets, and variations of the foregoing are contemplated. The monopoly sought is defined by the claims.

What is claimed is:
1. A thermoelectric power generating vessel comprising:
an inner wall, an outer wall, a flat base, multiple thermoelectric generators, a battery, and a DC-to-DC voltage converter circuit,
wherein the inner wall and the outer wall are each made from a thermally conductive metal and are separated from each other by an air gap,
wherein the inner wall and outer wall are formed together to have concentric polygon shapes when viewed from the top of the vessel,
wherein each of the multiple thermoelectric generators is arranged within the air gap along each side of the concentric polygon shape formed by the inner wall and the outer wall,
wherein each of the multiple thermoelectric generators has a first side in thermal contact with the inner wall and a second side in thermal contact with the outer wall, wherein the DC-to-DC voltage converter circuit is housed within the flat base, wherein each of the multiple thermoelectric generators is electrically connected to the battery through the DC-to-DC voltage converter circuit, and wherein the battery is charged by the multiple thermoelectric generators when a heated liquid is in the vessel.

2. The thermoelectric power generating vessel of claim 1, wherein the temperatures of the heated liquid and ambient air create a temperature differential of at least 32 degrees Celsius across each of the multiple thermoelectric generators for at least ten minutes.

3. The thermoelectric power generating vessel of claim 2, wherein the battery is charged with an average current of 20 mA generated from the multiple thermoelectric generators and the DC-to-DC voltage converter circuit, wherein the battery has a capacity of 110 mAh, and wherein the DC-to-DC voltage converter circuit has a conversion efficiency of at least 30%.

\* \* \* \* \*